US009281831B2

(12) United States Patent
Marie et al.

(10) Patent No.: US 9,281,831 B2
(45) Date of Patent: Mar. 8, 2016

(54) DIGITAL EXTRACTION AND CORRECTION OF THE LINEARITY OF A RESIDUE AMPLIFIER IN A PIPELINE ADC

(71) Applicant: Integrated Device Technology, Inc., San Jose, CA (US)

(72) Inventors: Herve Marie, Ver sur Mer (FR); Arnaud Biallais, Goneville sur Mer (FR)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 14/201,624

(22) Filed: Mar. 7, 2014

(65) Prior Publication Data
US 2015/0256189 A1 Sep. 10, 2015

(51) Int. Cl.
*H03M 1/06* (2006.01)
*H03M 1/00* (2006.01)
*H03M 1/18* (2006.01)

(52) U.S. Cl.
CPC .............. *H03M 1/002* (2013.01); *H03M 1/183* (2013.01)

(58) Field of Classification Search
CPC ............ H03M 1/0682; H03M 1/0602; H03M 1/0827; H03M 1/1033; H03M 1/164; H03M 1/167; H03M 1/468; H03M 3/35; H03M 3/438; H03M 1/06; H03M 1/069; H03M 1/1215; H03M 1/1225; H03M 1/129
USPC .......................... 341/118–121, 155, 161, 162
See application file for complete search history.

(56) References Cited

U.S. PATENT DOCUMENTS

| 5,047,772 A * | 9/1991 | Ribner | H03M 1/1061 341/118 |
| 6,456,223 B1 * | 9/2002 | Yu | H03M 1/08 341/161 |
| 6,970,125 B2 * | 11/2005 | Cesura | H03M 1/0641 341/136 |
| 7,602,323 B2 * | 10/2009 | Galton et al. | 341/118 |
| 7,830,287 B1 * | 11/2010 | Huang | H03M 1/0639 341/131 |
| 8,542,138 B2 * | 9/2013 | Galton | H03M 3/388 341/118 |
| 8,791,844 B2 * | 7/2014 | Meacham | H03M 1/0641 341/118 |
| 2006/0022854 A1 * | 2/2006 | Bjornsen | H03M 1/0641 341/120 |
| 2008/0258949 A1 * | 10/2008 | Galton | H03M 1/1004 341/120 |
| 2011/0012763 A1 * | 1/2011 | Lai | H03M 1/1004 341/120 |
| 2013/0207818 A1 * | 8/2013 | Moldsvor | H03M 1/1009 341/120 |

* cited by examiner

*Primary Examiner* — Linh Nguyen
(74) *Attorney, Agent, or Firm* — Hayes and Boone LLP.

(57) ABSTRACT

Embodiments of a pipeline analog-to-digital converter is provided. In accordance with some embodiments, a pipeline analog-to-digital converter includes a stage, the stage including a residue amplifier that amplifies a residual voltage generated by the stage to obtain an amplified residual voltage; a backend digitizer that digitizes the amplified residual voltage to generate a digitized residual; and a digital correction circuit that corrects the digitized residual according to which zone the digitized residual is found.

15 Claims, 8 Drawing Sheets

DIGITAL EXTRACTION AND CORRECTION OF THE LINEARITY OF A RESIDUE AMPLIFIER IN A PIPELINE ADC

TECHNICAL FIELD

Embodiments of the present invention are related pipeline Analog-to-Digital converters (ADCs) and, in particular, digital correction of residue amplifiers involved in stages of a pipeline ADC.

DISCUSSION OF RELATED ART

Analog-to-Digital converters are used anywhere there is a need to digitize analog signals. High performance ADCs are used in numerous applications and are typically characterized by operating at higher clock frequencies, with higher resolution, and at lower power consumption. One large application for high-performance ADCs is in telecommunications base stations, which receives large numbers of incoming signals that are all digitized. In such cases, the desired clock frequencies are typically in the GHz range. Further, because of the need to process a large number of input signals, the demand for a high number of ADCs on a single die is high.

One type of commonly used ADC is a pipeline ADC. A pipeline ADC includes a number of series connected stages, where each stage receives an input voltage. The input voltage may be the input voltage to the ADC if the stage is the first stage or a residue voltage received from the preceding stage in the pipeline. Each stage roughly digitizes the input signal and produces one or more bits of digitized data. The digitized portion is subtracted from the input voltage resulting in a difference voltage, which is amplified in a residue amplifier to generate a residue voltage. The residue voltage is then the input voltage to the following stage. The digitized data from each stage is then summed appropriately to form the digitized representation of the ADC's input voltage.

One of the limiting factors involved with ADCs is the quality of residue amplifier that is involved in each stage of the pipeline-ADC. High quality, linear amplifiers where the gain is well known are difficult and expensive to produce, especially in the numbers that are often used to obtain the necessary processing. The consequence is that ADCs are being implemented in more advanced complementary metal oxide semiconductor (CMOS) nodes. Advanced CMOS technology exhibits high performance for digital processing. Further, analog processing benefits from the higher speed and lower power consumption of digital-like functions such as clocks and comparators. However, high quality linear amplifiers are more difficult to achieve in Advanced CMOS technologies because the intrinsic gain of the transistors is smaller and the voltage range is also smaller.

Digital correction of some of the difficulties of the residue amplifier has been proposed. For example, a statistically based background digital calibration of the residue amplifier is described in "A 12b 75 MS/s Pipelined ADC Using Open-Loop Residue Amplification," Boris Murmann and Berhard E. Boser, IEEE Journal of Solid-State Circuits, Vol. 38, No. 12, December 2003. However, the statistically based extraction method as described in Murmann & Boser is slow, requires a large sampling base to converge, and requires dynamic analog references that add complexity to the analog processing. Another calibration procedure was disclosed in "A 12-Bit 200-MHz CMOS ADC", Bibhu Datta Sahoo and Behzad Razavi, IEEE Journal of Solid-State Circuits, Vol. 44, No. 9, September 2009. However, although some samples are reserved for calibration, no background extraction for non-linearity is provided. Another correction algorithm is provided in "A 130 mW 100 MS/s Pipelined ADC with 69 dB SNDR Enabled by Digital Harmonic Distortion Correction," Andrea Panigada and Ian Galton, IEEE Journal of Solid-State Circuits, Vol. 44, No. 12, December 2009. However, the approach provided requires multiple pseudo-random sequences and resultingly complicated processing.

Therefore, there is a need to develop high quality ADCs that can operate at higher clock frequencies with lower power consumption.

SUMMARY

In accordance with aspects of the present invention, a pipeline analog-to-digital converter is provided. In accordance with some embodiments, a pipeline analog-to-digital converter includes a stage, the stage including a residue amplifier that amplifies a residual voltage generated by the stage to obtain an amplified residual voltage; a backend digitizer that digitizes the amplified residual voltage to generate a digitized residual; and a digital correction circuit that corrects the digitized residual according to which zone the digitized residual is found.

A method of correction in a pipeline ADC according to some embodiments of the present invention includes determining a gain parameter based on a backend digitized value; determining an operating zone from a plurality of zones of a transfer function that is associated with the backend digitized value; integrating the gain parameter in one of a plurality integrators associated with the operating zone; and providing a correction of the backend digitized value associated with operation within each of the plurality of zones using parameters from the integrator associated with each of the plurality of zones.

These and other embodiments are further discussed below with respect to the following figures.

DETAILED DESCRIPTION

In the following description, specific details are set forth describing some embodiments of the present invention. It will be apparent, however, to one skilled in the art that some embodiments may be practiced without some or all of these specific details. The specific embodiments disclosed herein are meant to be illustrative but not limiting. One skilled in the art may realize other elements that, although not specifically described here, are within the scope and the spirit of this disclosure.

This description and the accompanying drawings that illustrate inventive aspects and embodiments should not be taken as limiting—the claims define the protected invention. Various changes may be made without departing from the spirit and scope of this description and the claims. In some instances, well-known structures and techniques have not been shown or described in detail in order not to obscure the invention.

Figure 1:
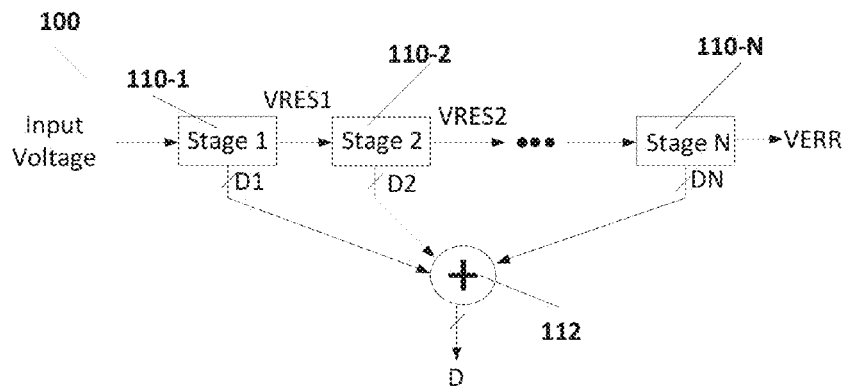
FIG. 1 illustrates a pipeline ADC.

FIG. 1 illustrates a pipeline analog-to-digital converter 100. As shown in FIG. 1, an analog input voltage V is received by stage 110-1. Successive stages 110-1 through 110-N are arranged sequentially to digitize the input voltage. Each of stages 110-1 through 110-N outputs a digitized value $D_1$ through $D_N$, respectively, and a residue voltage $V_{RES1}$ through $V_{RESN}$, respectively. The digitized values $D_1$ through $D_N$ are summed appropriately in adder 112 to provide a digitized value D of the input voltage V. The last residue voltage from stage 110-N can provide an indication of the error in digitizing the input voltage, or may itself be digitized to provide higher resolution to the resulting digitized value.

Figure 2:
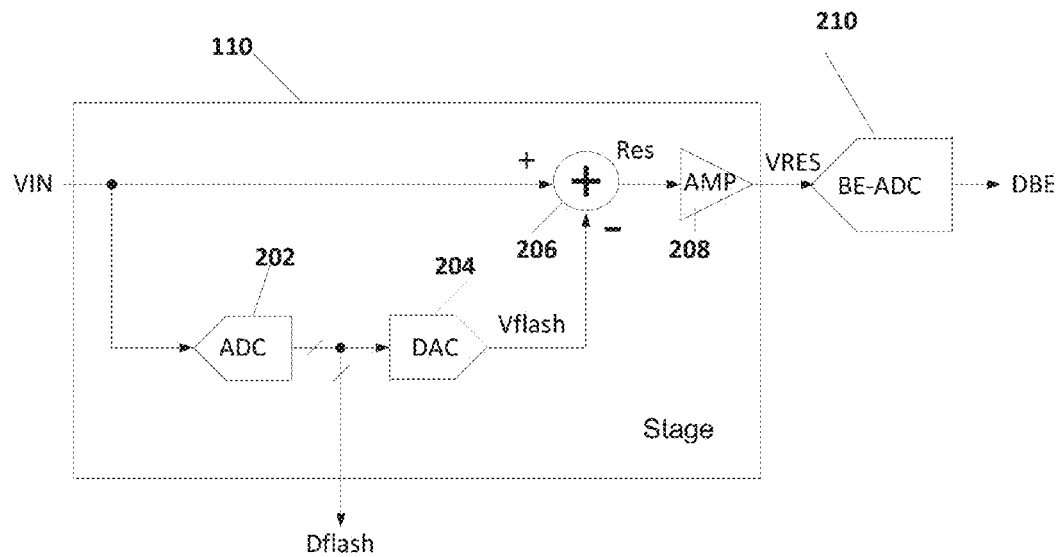
FIG. 2 illustrates a single stage of a pipeline ADC.

FIG. 2 illustrates a stage 110, which may be any one of stages 110-1 through 110-N. As shown in FIG. 2, stage 110 receives a voltage $V_{IN}$ and outputs a residual voltage $V_{RES}$. Voltage $V_{IN}$ is digitized in an analog-to-digital converter 202, which outputs a digitized version $D_{flash}$. $D_{flash}$ is then converted by digital-to-analog converter 204, which matches ADC 202, to provide analog signal $V_{flash}$. $V_{flash}$ is subtracted from $V_{IN}$ in summer 206 to provide a residual voltage RES. Voltage RES is then amplified in amplifier 208 to provide the digital voltage $V_{RES}$ for the following stage 110. $V_{RES}$ is then further digitized in back-end ADC 210 to provide the digitized back-end $D_{BE}$, which is the digitized voltage $V_{RES}$. $D_{flash}$, $D_{BE}$, and other digitized voltages from others of stages 110 represent digitized values $D_1$ through $D_N$ shown in FIG. 1, with $D_{flash}$ being one of digitized values $D_1$ through $D_N$ and $D_{BE}$ representing the summed values of the digitized values from the following ones of stages 110.

In a conventional pipelined ADC, amplifier 208—also referred to as the residue amplifier—has severe requirements in terms of gain and linearity accuracy. At each stage 110, the settling time of residue amplifier 208 determines the maximum speed at which ADC 100 can run. These constraints result because residue amplifier is the dominant source of power consumption in pipeline ADC 100. This issue becomes even more difficult in advanced complementary metal-oxide semiconductor (CMOS) technologies where the voltage headroom is small. For these reasons, there is a need to reduce the constraints on residue amplifier 208 in order to reduce power consumption and increase speed.

As shown in FIGS. 1 and 2, pipeline ADC stage 110 processes an incoming input signal, $V_{in}$, and delivers $D_{flash}$, which is a coarse digitized form of the input signal $V_{in}$. The voltage $V_{RES}$ is an analog residue created by subtracting the analog value of $D_{flash}$ from the input voltage $V_{in}$, amplified by residue amplifier 208. The residue, $V_{RES}$, is then digitized by the backend ADC 210 resulting in the digitized value $D_{BE}$. The digital equivalent of the input signal $D_{out}$ is then the sum of the stage $D_{flash}$, typically representing the most-significant-bits (MSBs) and of $D_{BE}$ representing the least-significant-bits (LSBs). As illustrated in FIGS. 1 and 2, $D_{flash}$ can be any number of bits and DBE can be any number of bits. If any stages precede the particular stage 110 illustrated in FIG. 2, then that stage provides the input voltage $V_{IN}$ of the illustrated stage 110. Therefore $V_{IN}$ may be the residue voltage from the immediately preceding stage.

The gain of residue amplifier 208 can be any value. However, scaling of the digital outputs $D_{flash}$ of individual stages that are combined in summer 112 to provide the digitized value representing the input voltage ADC 100 is simpler if the gain is a power of two (2), e.g. 2, 4, 8, or other power of two. For example, if $D_{flash}$ is three-bits, then it is convenient for the gain of amplifier 208 to be four (which provides some redundancy).

For high resolution ADCs, the residue amplifier gain should be determined with high precision. The traditional approach is to embed residue amplifier 208 within a feedback loop. The gain is therefore set by a ratio of passive elements (usually capacitors), at the condition that the amplifier open loop gain is sufficiently high (more than 80 dB typically). The residue amplifier 208 should settle within half a clock period. These and other constraints on the performance of residue amplifier 208 usually result in residue amplifier 208 being the dominant source of power consumption in a pipeline ADC 100.

Further, while implementing a pipeline ADC in advanced CMOS technologies, there are additional difficulties. For example, the voltage headroom allowed for transistors gets smaller and transistor reliability becomes an issue, resulting in increased difficulty to build a linear amplifier. Additionally, the transistor intrinsic gain gets smaller, resulting in difficulty in implementing an amplifier with sufficient gain. On the other hand, digital processing becomes more efficient at each new generation of CMOS technology. Consequently, techniques that reduce the analog implementation, even if additional digital processing is required, are highly desirable.

In accordance with embodiments of the present invention, the constraint that residue amplifier 208 be linear is removed. Removing this constraint allows the use of a less linear residue amplifier 208 that results in lower power consumption, and lower cost. Digital processing can then be used to adjust the stages to correct for the non-linearity of residue amplifier 208 and discrepancies in the gain and reduce the requirements on the analog processing portions of each stage 110. Digital processing can be much more cost and power efficient in advanced CMOS technologies than is analog processing. Consequently, in accordance with embodiments of the present invention, digital processing provides feed-back loops for correction gain and for correction of linearity.

In some embodiments, a known pseudo-random sequence can be injected at the input of residue amplifier and then subtracted from the digitized value digitally. The correlation of the pseudo-random sequence with the signal after digital subtraction can determine whether the gain on the residue (both from the residue amplifier 208 and other processing) is too low or too high. Consequently, the gain of residue amplifier can be corrected. A digital feedback loop including the correlator and multiplier according to embodiments of the present invention may cause the system to converge to zero gain error. The presence of the ADC signal in the feedback loop can be averaged out by the correlator.

In some embodiments, the non-linearity of the residue amplifier can also be adjusted digitally. The residue amplifier output signal can be split into multiple zones, for example an inner zone (small signals) and an outer zone (large signals). In that case, multiple correlators can be used and a particular correlator can be associated with each zone. For example, a correlator associated with an outer zone, where the non-linearity of the residue amplifier will be most evident, can be used to correct non-linearity (e.g., distortion of order 3 that dominates) while the correlator associated with the inner zone, where the non-linearity of the residue amplifier will be least evident, can be used to correct for gain errors. Both gain and linearity extraction and correction loops can be used in parallel, are fully digital, and can be operating in the background.

Figure 3A:
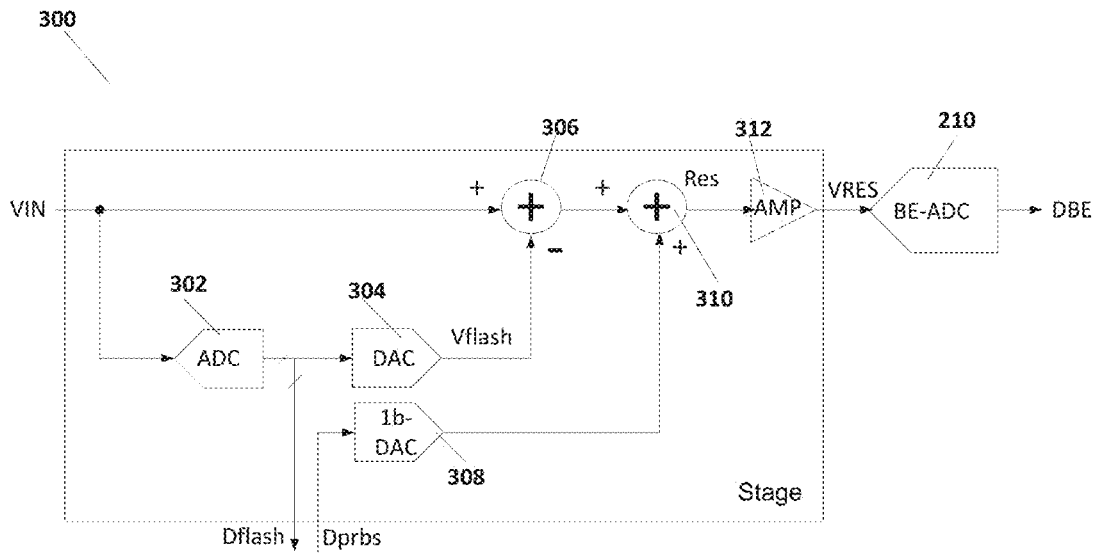
FIG. 3A illustrates a stage of a pipeline ADC which includes digital processing.

FIG. 3A illustrates an embodiment of a stage 300, which can be used in place of stages 110 shown in FIG. 1. As shown in FIG. 3A, the input voltage $V_{IN}$, which may be the input voltage to the pipeline ADC as a whole if stage 300 is the first stage or a residue voltage from a preceding stage if stage 300 is a later stage, is received and digitized in ADC 302. ADC 302 can be a digitizer of any bit size that produces a digital representation $D_{flash}$ of $V_{in}$ appropriate for its resolution. The digital output from ADC 302, $D_{flash}$, is then input to DAC 304. DAC 304 is a digital-to-analog converter comparable with ADC 302 that produces an analog voltage $V_{flash}$ according to the digital value $D_{flash}$. In summer 306, $V_{flash}$ is subtracted from the input voltage $V_{in}$ to generate a residual voltage. As shown in FIG. 3A, the residual voltage from summer 306 is input into summer 310. A digitized pseudo-random binary sequence (PRBS) from a known PRBS generator is digitized in a 1-bit DAC 308 and summed with the residual voltage in summer 310. The resulting residual is amplified in amplifier 312 to produce $V_{RES}$. As discussed with respect to FIG. 2, $V_{RES}$ is digitized by back-end ADC 210 to result in the digitized value Of $V_{RES}$, $D_{BE}$.

Figure 3B:
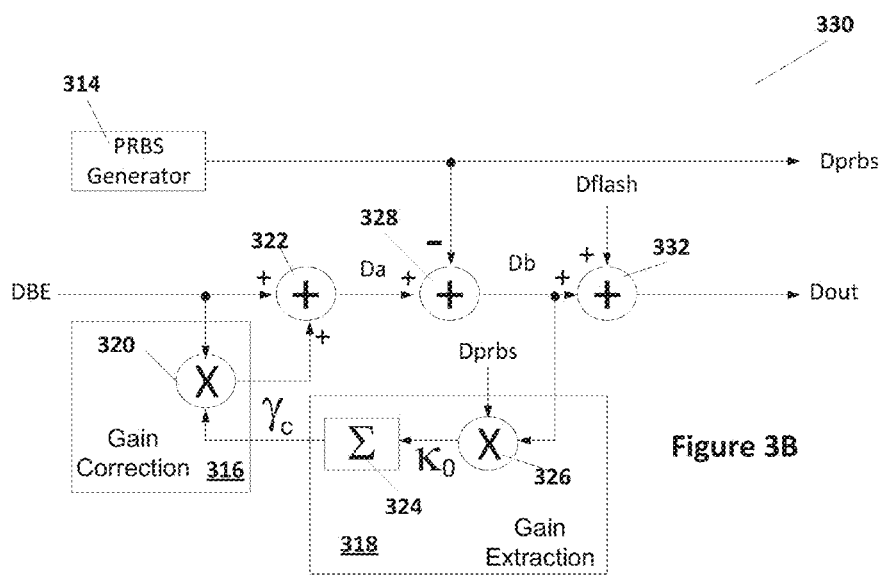
FIG. 3B illustrates an example of digital processing and corrections for a pipeline ADC.

FIG. 3B illustrates digital processing 330 of the correction for amplifier gain consistent with stage 300 shown in FIG. 3A. As shown in FIG. 3B, PRBS generator 314 is the known PRBS generator that generates a pseudo-random number sequence $D_{prbs}$, which is input to DAC 308 shown in FIG. 3A. Digital processing 330 includes a gain extraction 318 and a gain correction 316. As input, digital processing 330 receives the digitized input $D_{BE}$. In summer 322, $D_{BE}$ is summed with the output signal from gain correction 316 to produce a signal Da. The generated sequence $D_{prbs}$ is then subtracted from $D_a$ in summer 328. The digitized value $D_{flash}$ from the stage 300 illustrated in FIG. 3A is then added in summer 332 to arrive at the digitized value $D_{out}$.

Gain extraction 318 receives the digital value $D_b$ and multiplies it by $D_{prbs}$ in multiplier 326 to generate the parameter $K_0$. Since the input signal $D_{BE}$ itself is averaged out by integrator 324 and $D_{prbs}$ is equal to ±1, the parameter $K_0$ can be given by $$K_0 = (GD_{prbs} - D_{prbs})D_{prbs} = G - 1,$$

where G is the normalized gain defined as $g_{act}/g_{ideal}$, $g_{act}$ being the actual gain and $g_{ideal}$ being the desired gain. The output correction factor $\gamma_c$, then, is the value $K_0$ integrated in integrator 324. Since the desired overall normalized residue gain (analog and digital) is 1, once convergence is complete the correction factor $\gamma_c$ should be the difference between the normalized gain and 1. For example, if the actual gain $g_{act}$ is 3.96 and the ideal gain $g_{ideal}$ is 4, then $\gamma_c$ will converge to 0.01. Gain correction 316 multiplies the correction factor $\gamma_c$ by the input value $D_{BE}$ in multiplier 320 and adds that to the input value $D_{BE}$ in summer 322 to correct for gain.

Figure 4:
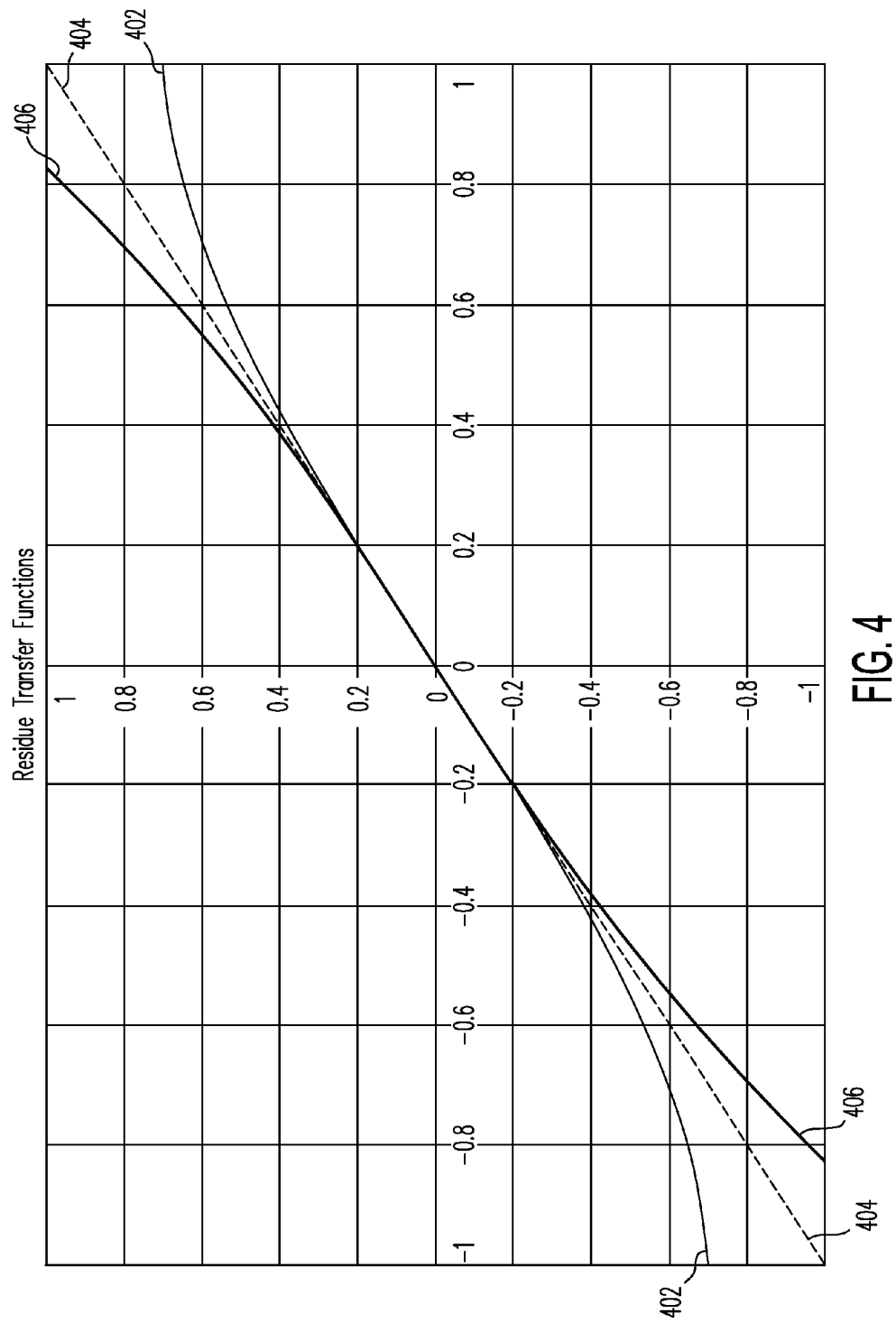
FIG. 4 illustrates residue transfer functions in a pipeline ADC.

In order to further remove operational constraints on the residue amplifier, embodiments of the present invention further compensates for residue amplifier nonlinearity. FIG. 4 illustrates the residue transfer functions and a correction according to some embodiments of the present invention. In FIG. 4, the y-axis represents the output voltage of the amplifier while the x-axis indicates the input voltage of the amplifier. As illustrated in FIG. 4, curve 402 illustrates the analog transfer function of the residue amplifier, which illustrates significant non-linearity at the extremes and primarily linear behavior for small values. Curve 406 illustrates the digital correction that would linearize curve 402. Curve 404 illustrates the resulting corrected curve (curve 402 corrected by curve 406). Typically, the residue amplifier compresses the residue signal.

In some examples, the amplifier dominant term of non-linearity is primarily of third order. A third order correction, although not exactly generating the correction, can be accurate enough to remove most of the non-linearity and can be easily implemented with multipliers and other digital components that are easily provided in CMOS technologies. For example, if the amplifier input is x, assuming a third-order non-linearity the amplifier output y is given by $$y = x - \delta_3 x^3.$$

The residue, after linearity correction, is then given by $$z = y + \delta_c y^3$$
$$= (x - \delta_3 x^3) + \delta_c (x - \delta_3 x^3)^3$$
$$= x + (-\delta_3 + \delta_c)x^3 - 3\delta_3 \delta_c x^5 + 3\delta_3^2 \delta_c x^7 + \delta_3^3 \delta_c x^9.$$

Setting the correction $\delta_3 \approx \delta_c$, with both parameters being much smaller than 1, then in most cases $z \approx x$. In other words, the linearity correction has provided a linear response to the input value x.

Figure 5:
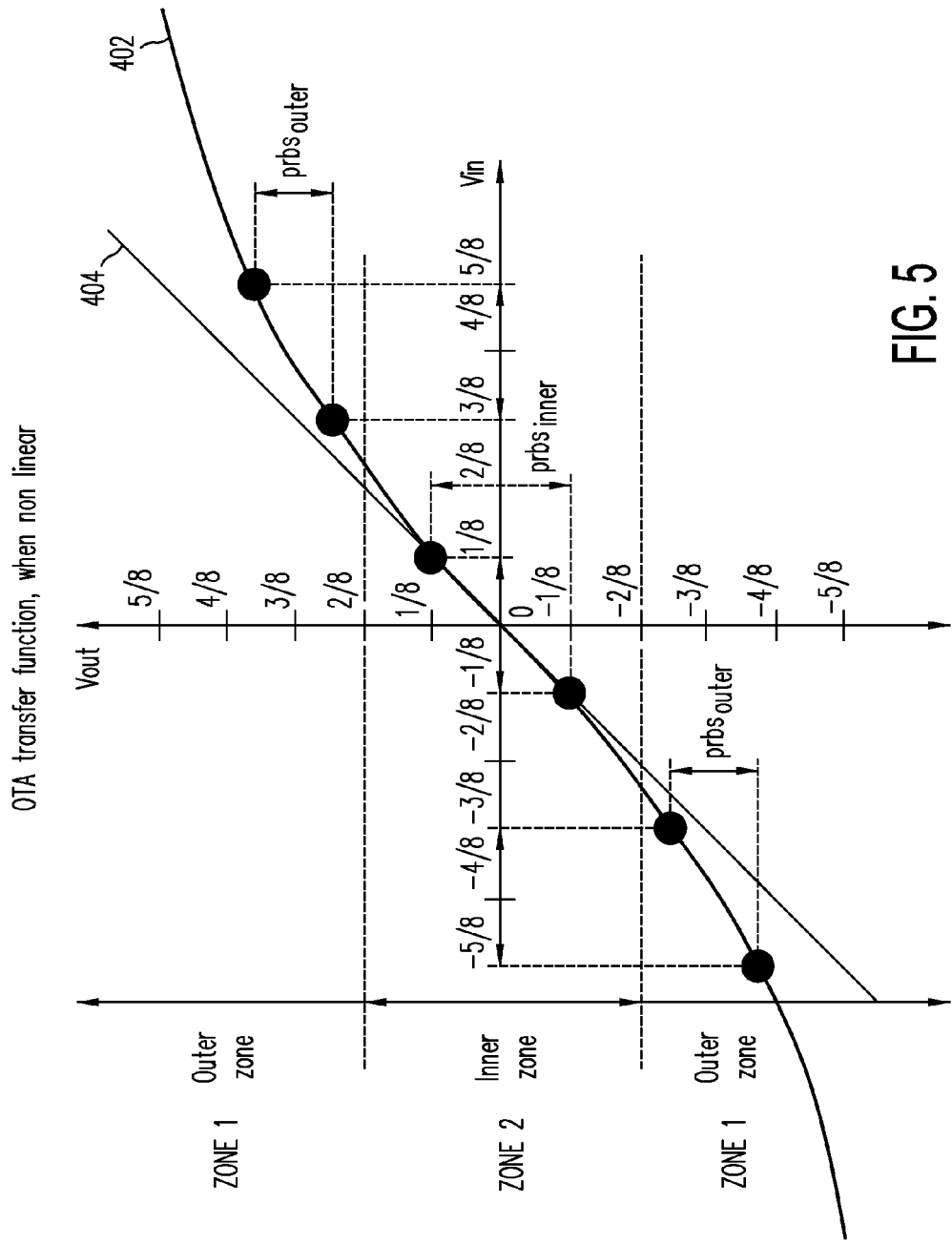
FIG. 5 illustrates a non-linear transfer function of a pipeline ADC.

FIG. 5 illustrates a linearity extraction method according to some embodiments of the present invention. The residue amplifier transfer function curve 402 is shown along with the linear (gain 1) curve 404. As shown in FIG. 5, multiple zones are defined. In FIG. 5, Zone 1 includes the outer zones of the transfer function, which are the zones where the non-linearity of transfer function curve 402 become the most prominent. Zone 2 is the inner zone, where the non-linearity of transfer function curve 402 is mostly linear, with small non-linearity of curve 402. As is further discussed below, extractions provided in Zone 2 can be used for gain correction while extractions provided in Zone 1 can be used for linearity correction. In some embodiments, multiple zones can be used, especially if the non-linearity correction involves higher-order corrections.

Figure 6:
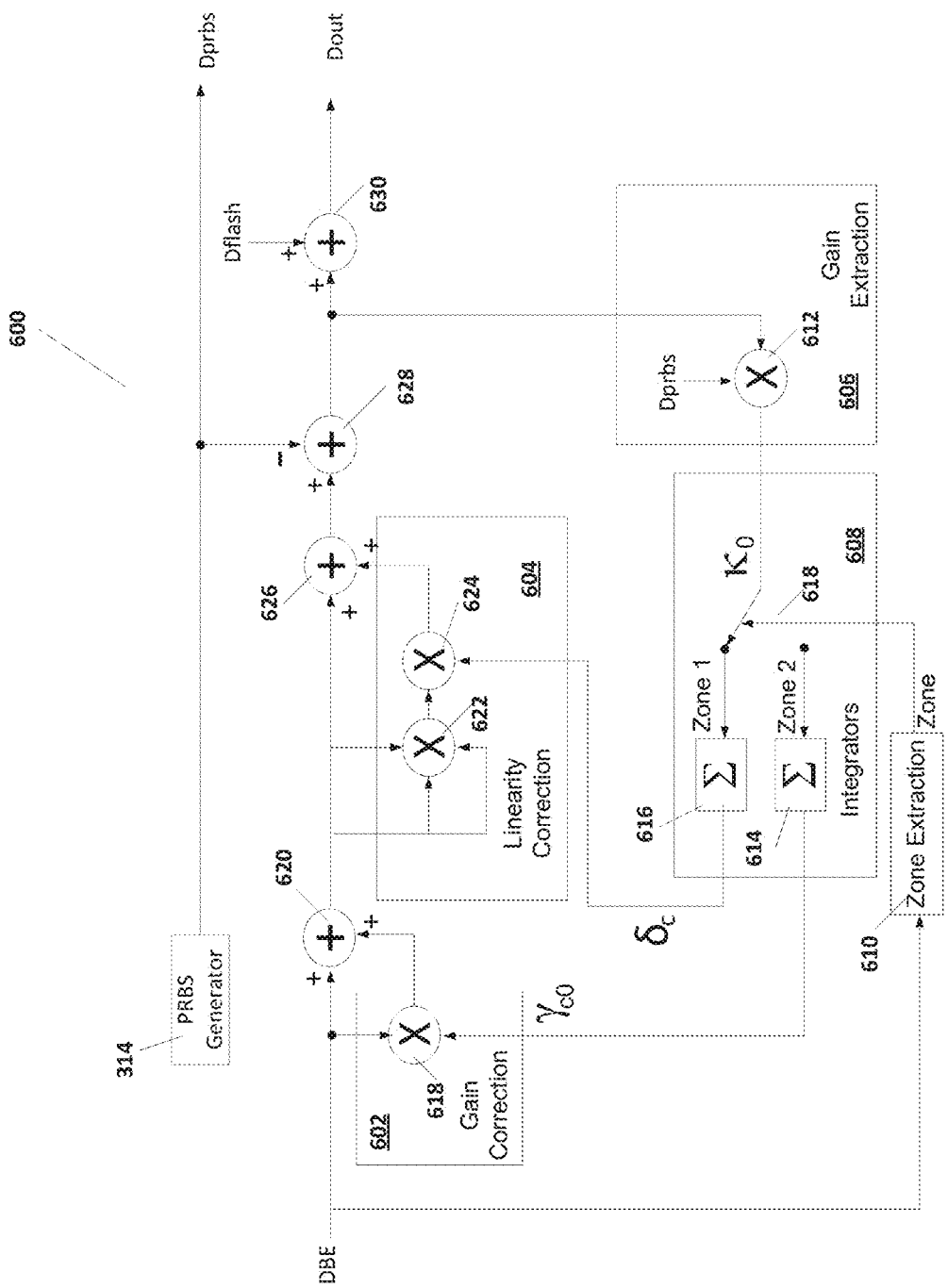
FIG. 6 illustrates digital processing according to some embodiments of the present invention.

FIG. 6 illustrates digital processing 600 that can be used with the stage 300 illustrated in FIG. 3A in place of digital processing 330 illustrated in FIG. 3B. Digital process 600 provides for both a gain correction and a non-linearity correction utilizing a multi-zone processes according to some embodiments of the present invention. As shown in FIG. 6, digital processing 600 includes PRBS generator 314 to generate the pseudo-random binary sequence Dprbs. In the embodiment shown in FIG. 6, there are two feed-back loops represented by gain correction 602 and linearity correction 604.

As shown in FIG. 6, the digital input $D_{BE}$ is added to an output from gain correction 602 in summer 620. The output from summer 620 is added to the output from linearity correction 604 in summer 626 and $D_{prbs}$ is subtracted in summer 628. The resulting digital value is summed with the digitized value $D_{flash}$ in summer 630 to form the output digital value $D_{out}$.

Gain extraction 606 receives the output from summer 628 and multiplies it by $D_{prbs}$ in multiplier 612. As discussed above with respect to gain extraction 318, the value $K_0 = G - 1$. The output of gain extraction 606, $K_0$, is input to switch 618, which switches $K_0$ to integrator 616 or integrator 614 depending on the output of zone extraction 610. Zone extraction 610 switches $K_0$ to integrator 614 if $D_{BE}$ is in an inner zone (Zone 2) as shown in FIG. 5 and switches $K_0$ to integrator 616 if $D_{BE}$ is in an outer zone (Zone 1) as shown in FIG. 5. Although only two zones are illustrated in FIG. 6, where Zone 2 is primarily a linear zone and Zone 1 is a non-linear zone, there may be any number of zones included in the processing.

Zone 2, as shown in FIG. 5, is within the linear portion of the residue amplifier transfer function. Therefore, integrator 614, which integrates the value $K_0$ if $D_{BE}$ is within Zone 2, generates a gain correction factor $\gamma_{c0}$ that is used in gain correction 602. As shown in FIG. 6, gain correction 602 multiplies the value $D_{BE}$ by the gain correction factor $\gamma_{c0}$ in multiplier 618. The result of the multiplication in multiplier 618 is added to $D_{BE}$ in summer 620.

Zone 1, as shown in FIG. 5, is within the non-linear portion of the residue amplifier transfer function. Therefore, integrator 616, which integrates the value of $K_0$ if $D_{BE}$ is within Zone 1, generates a linearity correction factor $\delta_c$ that is input to linearity correction 604. Linearity correction 604 includes multiplier 622 and multiplier 624. Multiplier 622 inputs $D_{BE}$ corrected by the amount $\gamma_{c0}D_{BE}$ from summer 620 and forms its cube, $Db^3$. Multiplier 624 receives $D_b^3$ from multiplier 622 and multiplies $D_b^3$ by the linearity correction factor $\delta_c$. As shown in FIG. 6, the output from linearity correction 604, $\delta_c D_b^3$, is added to the output from summer 620, $D_b$, in summer 626.

Therefore, for each sample within the inner zone (Zone 2), correlation is applied and the error signals are fed back to the gain correction integrator 614. For each sample within the outer, non-linear, zone, a similar correlation is applied and the error gains are fed to integrator 616 and applied to the linearity correction 604. In steady state, the residue transfer slope in the inner zone (Zone 2) and that in the outer zone (Zone 1) are thus both adjusted.

As is further shown in FIG. 6, zone extraction 610 receives the value DBE and determines the position of switch 618. A simple comparison of the value DBE with the definition of the zone boundaries will determine whether switch 618 is set consistent with the zones. For example, from FIG. 5, if the absolute value of DBE is greater than 2/8 switch 618 is set to integrator 616 (Zone 1) and if less than 2/8 switch 618 is set to integrator 614 (Zone 2).

As discussed above, and illustrated in FIG. 6, the correction for the remaining residue $z=y+\delta_c y^3$ was utilized. However, any kind of nonlinear correction function can be used and implemented in digital correction according to embodiments of the present invention. Systems with more extraction zones and more parameters can be used and implemented digitally.

Figure 7:
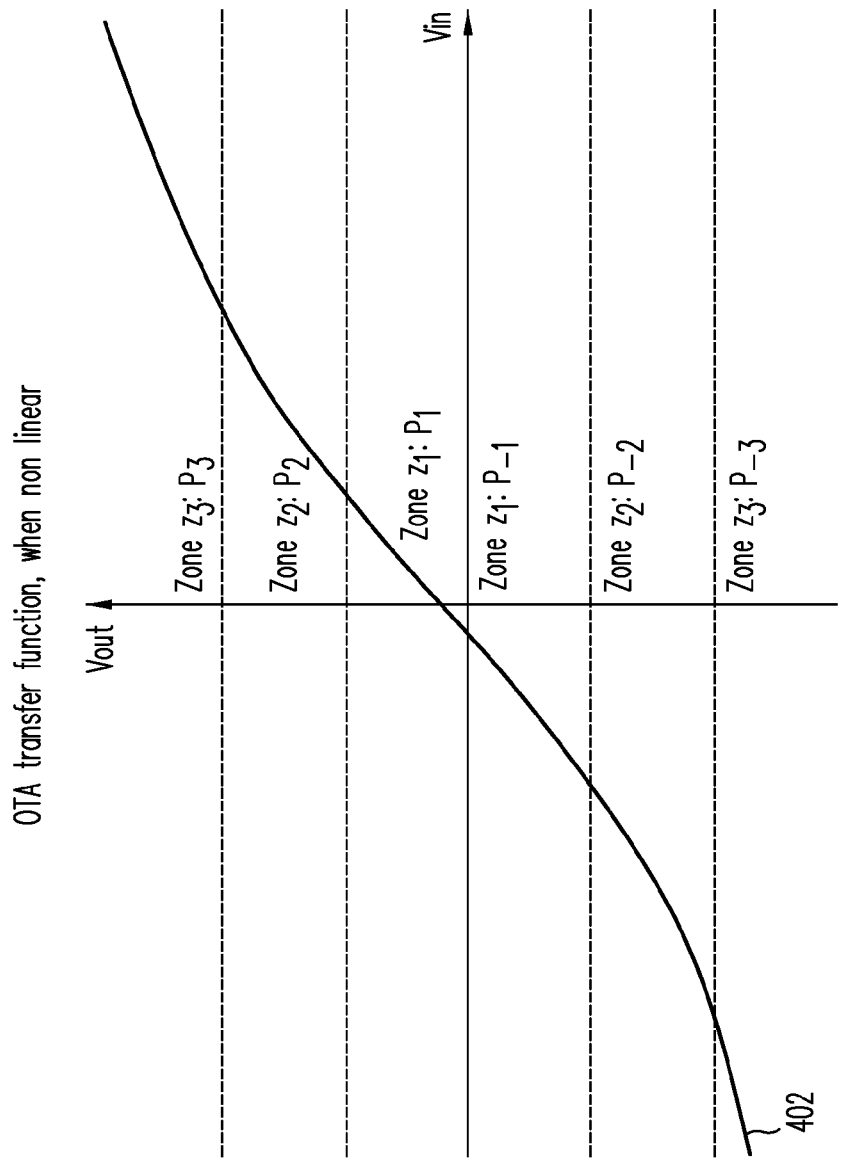
FIG. 7 illustrates a transfer function using multiple zones.

FIG. 7 illustrates a residue amplifier transfer function that, as an example, has been segregated into six zones, labeled Zone −3, Zone −2, Zone −1, Zone 1, Zone 2, and Zone 3. Zone −1 and Zone 1 represent the roughly linear portion of the curve while the other zones are nonlinear portions. The slope of the transfer function, which corresponds to the gain G, in each of Zone −3, Zone −2, Zone −1, Zone 1, Zone 2, and Zone 3 is given $p_{-3}$, $p_{-2}$, $p_{-1}$, $p_1$, $p_2$, and $p_3$, respectively.

The correction function can account for a $5^{th}$ order distortion and an offset, given by $$z=a_1(y-y_0)+a_3(y-y_0)^3+a_5(y-y_0)^5.$$

This correction function has four parameters to be calibrated, $y_0$, $a_1$, $a_3$, and $a_5$. The parameters can be calculated from the extracted slopes as $$y_0=(p_1+p_2+p_3)-(p_{-1}+p_{-2}+p_{-3})$$

$$a_1=p_{-1}+p_1$$

$$a_3=p_{-2}+p_2$$

$$a_5=p_{-3}+p_3$$

Similar to digital processing 600 illustrated in FIG. 6, a digital processing can be provided to implement this, or any other, correction function.

Figure 8A:
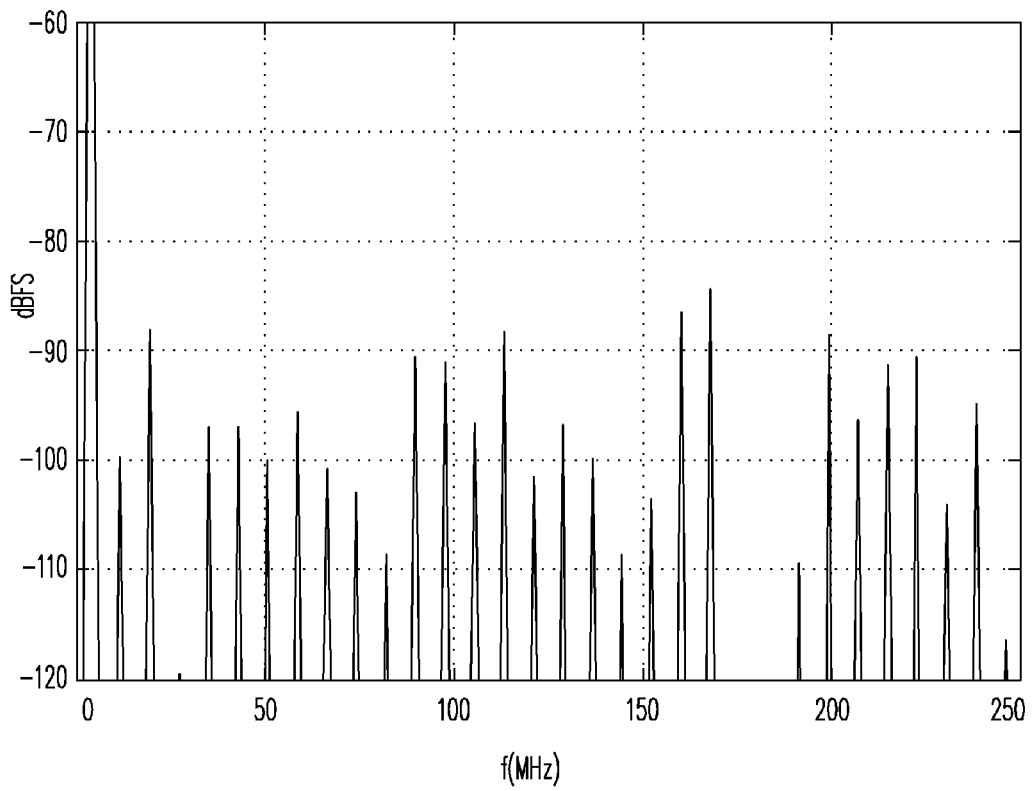
FIGS. 8A and 8B illustrate performance of an analog-to-digital converter according to some embodiments of the present invention.
Figure 8B:
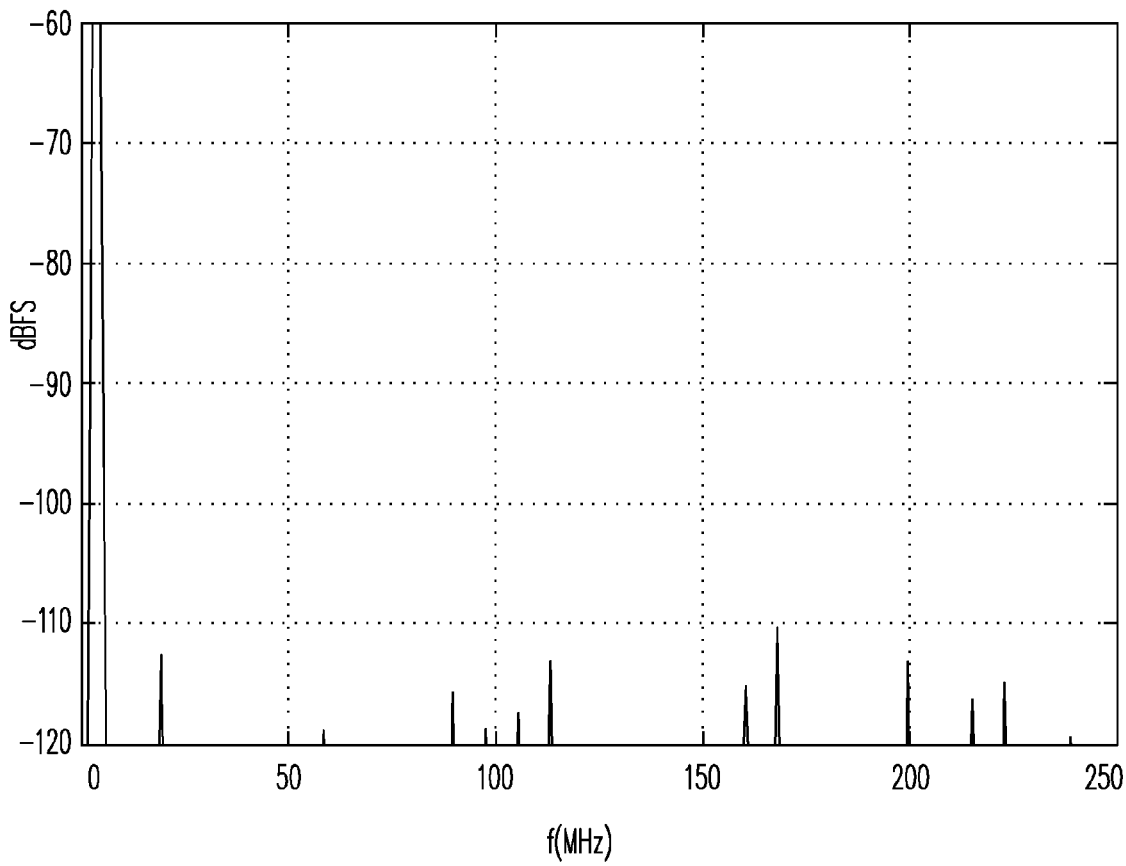

FIGS. 8A and 8B illustrate a simulation of a CMOS open loop residue amplifier, with and without a digital correction according to some embodiments of the present invention. The simulation shows a Fourier Transform up to the Nyquist frequency of the pipeline model ADC converter. The chart shows decibels compared to full scale (dBFS) as the y-axis and frequency on the x-axis. As shown in FIG. 8A, without correction according to embodiments of the present invention, the spurious-free dynamic range SFDR is 83.5 dBc with a signal-to-noise ration SNDR of 77.1 dBc. However, with correction, as shown in FIG. 8B, the SFDR is improved to 109.7 dBC and the SNDR is improved to 102.7 dBc.

The above detailed description is provided to illustrate specific embodiments of the present invention and is not intended to be limiting. Numerous variations and modifications within the scope of the present invention are possible. The present invention is set forth in the following claims.

What is claimed is:

1. A pipeline analog-to-digital converter, comprising:
   a stage, the stage including a residue amplifier that amplifies a residual voltage generated by the stage to obtain an amplified residual voltage;
   a backend digitizer that digitizes the amplified residual voltage to generate a digitized residual; and
   a digital correction circuit that determines an operating zone from a plurality of zones of a transfer function that is associated with the digitized residual by comparing the digitized residual with operating parameters of the operating zone and corrects the digitized residual according to which operating zone the digitized residual is found.

2. The pipeline analog-to-digital converter of claim 1, wherein the stage includes
   an analog-to-digital converter that digitizes an analog input voltage $V_{IN}$ to generate a digital value $D_{flash}$,
   a digital-to-analog converter that converts $D_{flash}$ to an analog voltage $V_{flash}$,
   a first summer that subtracts the analog voltage $V_{flash}$ from the input voltage $V_{IN}$ to generate a first residual voltage,
   a one-bit digital-to-analog converter that generates an analog voltage from a pseudo-random digital sequence,
   a second summer that receives the first residual voltage and adds the analog voltage from the pseudo-random digital sequence to generate the second residual voltage, and
   wherein the residue amplifier amplifies the second residual voltage.

3. The pipeline analog-to-digital converter of claim 2, wherein the digital correction includes
   a gain extraction that generates a value $K_0$ given a corrected digital residual,
   zoned integrators that receive the value $K_0$ according to the operating zone;
   a gain correction that receives a gain correction parameter from a first integrator in the zoned integrators and provides a first correction to the digital residual, and
   a linearity correction that receives a linearity correction parameter from a second integrator in the zoned integrators and provides a second correction to the digital residual.

4. The pipelined analog-to-digital converter of claim 3, further including a second linearity correction that receives a second linearity correction parameter from a third integrator in the zoned integrators and provides a third correction to the digital residual.

5. The pipelined analog-to-digital converter of claim 3, wherein the gain extraction includes
multiplying the digital residual with the pseudo random digital sequence to generate the value $K_0$.

6. The pipelined analog-to-digital converter of claim 3, wherein the zoned integrators includes a switch coupled to a zone extraction circuit, the zone extraction circuit determining the operating zone based on the digitized residual, the switch providing the value $K_0$ to one or more integrators based on the switch.

7. The pipelined analog-to-digital converter of claim 3, wherein the gain correction includes a multiplier that multiplies the digitized residual by the gain correction factor $\gamma_{c0}$ that is added to the digitized residual in the first correction.

8. The pipelined analog-to-digital converter of claim 3, wherein the linearity correction includes a first multiplier that calculates a cube of the digitized residual and a second multiplier that multiplies the cube of the digitized residual by the linearity correction parameter, the result being added to the digitized residual as the second correction.

9. A method of correction in a pipeline ADC, comprising
determining a gain parameter based on a backend digitized value;
determining an operating zone from a plurality of zones of a transfer function that is associated with the backend digitized value by comparing the backend digitized value with operating parameters of the operating zone to determine the operating zone;
integrating the gain parameter in one of a plurality of integrators associated with the operating zone;
providing a correction of the backend digitized value associated with operation within each of the plurality of zones using parameters from the integrator associated with each of the plurality of zones.

10. The method of claim 9, wherein determining the gain parameter includes multiplying a corrected backend digitized value by a pseudo random digitize sequence that was added during a stage of the pipeline ADC.

11. The method of claim 9, wherein integrating the gain parameter includes determining which of the plurality of integrators is associated with the operating zone and providing the gain parameter to the associated integrator.

12. The method of claim 11, wherein providing a correction of the backend digitized value includes
providing a gain correction; and
providing a linearity correction.

13. The method of claim 12, wherein providing a gain correction includes
receiving a gain correction factor from a first integrator of the plurality of integrators that is associated with a linear zone;
multiplying the gain correction factor by the backend digitized value to provide a gain correction; and
adding the gain correction to the backend digitized value to provide a first correction.

14. The method of claim 12, wherein providing a linearity correction includes
receiving a linearity correction factor from a second integrator of the plurality of integrators that is associated with a nonlinear zone;
calculating a cube of a value related to the backend digitized value;
multiplying the cube by the linearity correction factor to generate the linearity correction; and
adding the linearity correction to the value to provide a second correction.

15. The method of claim 14, wherein the value is the first correction.

* * * * *